(12) United States Patent
Kraus et al.

(10) Patent No.: US 6,350,313 B2
(45) Date of Patent: Feb. 26, 2002

(54) METHOD OF PRODUCING A POLYCRYSTALLINE SILICON ROD

(75) Inventors: Heinz Kraus, Zeilarn; Matthäus Schantz, Reut; Peter Niedermeier, Burghausen, all of (DE)

(73) Assignee: Wacker-Chemie GmbH, München (DE)

( * ) Notice: Subject to any disclaimer, the term of this patent is extended or adjusted under 35 U.S.C. 154(b) by 0 days.

(21) Appl. No.: 09/803,335

(22) Filed: Mar. 9, 2001

(30) Foreign Application Priority Data

Apr. 20, 2000 (DE) .......................... 100 19 601

(51) Int. Cl.⁷ .............................................. C30B 15/00
(52) U.S. Cl. ............................................... 117/13
(58) Field of Search .......................................... 117/13

(56) References Cited

U.S. PATENT DOCUMENTS

| | | | |
|---|---|---|---|
| 4,084,354 A | | 4/1978 | Grandia et al. |
| 4,712,535 A | | 12/1987 | Fujisawa |
| 5,882,786 A | * | 3/1999 | Nassau et al. .............. 428/336 |
| 5,955,357 A | | 9/1999 | Bender et al. |
| 5,961,944 A | * | 10/1999 | Aratani et al. .............. 423/348 |

* cited by examiner

*Primary Examiner*—Felisa Hiteshew
(74) *Attorney, Agent, or Firm*—Collard & Roe, P.C.

(57) ABSTRACT

A method of producing a polycrystalline silicon rod is by depositing silicon on a carrier rod and cutting to size a molding produced in the process. In order that the silicon rod is given a rod end which is free of cracks and flaking, the rod is rotated about its longitudinal axis and cut through with a parting tool.

7 Claims, 2 Drawing Sheets

METHOD OF PRODUCING A POLYCRYSTALLINE SILICON ROD

BACKGROUND OF THE INVENTION

1. Field of the Invention

The present invention relates to a method of producing a polycrystalline silicon rod, which is obtained by depositing silicon onto a carrier rod and cutting to size a molding produced in the process.

2. The Prior Art

A silicon rod produced in this way is suitable in particular as a feed rod in the production of a monocrystal by zone pulling (FZ-Process) or as a refilling rod for crucible pulling (CZ-Process). However, a precondition for this is that the silicon rod has at least one rod end which is free of cracks and flaking.

In order to produce the molding, thin carrier rods of silicon, so-called thin rods, are joined in a deposition reactor and heated electrically to reaction temperature by the direct passage of current. During the deposition of silicon, halogen-containing silicon compounds or silane decomposes from the gas phase at the surface of the thin rods. At the same time, the diameter of the thin rods increases. After a desired diameter has been reached, the deposition is ended and the molding produced is cooled down to ambient temperature and removed from the reactor. The molding is generally U-shaped, having two polycrystalline rods as legs and a bridge of polycrystalline silicon joining the legs. At their ends, the legs are grown with the electrodes for the current supply.

The temperature differences in the cooling molding are greater, the greater the diameter of the rods. The maximum temperature prevails in the cross-sectional center of the rods, the lowest temperature in the edge region of the rods. Because of this temperature profile, tensile and compressive stresses are produced in the rods during the cooling of the molding. Planes of equal stress lie cylindrically around the longitudinal axes of the rods.

In a conventional sawing process, the rods are fixed and cut through with a saw with vertical feed perpendicular to the stress planes and, in so doing, are separated from the electrodes and the bridge. Here, in particular in the case of rods with a large diameter, there is a considerable risk that the stress present in the rods will be released by the formation of cracks and flaking. If cracks and flaking occurs, the saw cut has to be repeated at a different rod position, to be specific until a cut face is obtained which is free of cracks and flaking. With each saw cut, the remaining rod becomes shorter and the yield becomes lower. The cracked pieces of rod which arise during the sawing have a lower quality, since they cannot be used as feed rods for zone pulling or as refilling rods for crucible pulling.

SUMMARY OF THE INVENTION

It is an object of the present invention to provide a method with which a polycrystalline silicon rod with at least one rod end that is free of cracks and flaking can be obtained with a high yield and cost-effectively.

The above object of the invention is achieved by providing a method of producing a polycrystalline silicon rod, which is obtained by depositing silicon on a carrier rod and cutting to size a molding produced in the process, which comprises rotating the polycrystalline silicon rod about its longitudinal axis and cutting through with a parting tool at least one point, and producing at least one rod end which is free of cracks and flaking. The rotating rod can be severed at one position or at a number of positions at the same time.

As a result of the rotation of the silicon rod, the action of the parting tool is carried out in such a way that the stress planes are cut through one after another. Thus, stress dissipation by crack formation is therefore avoided.

The method of the invention provides for the polycrystalline silicon rod to be cut initially from a molding which is grown by gas-phase deposition of silicon onto carrier rods in a deposition reactor. In this case, the electrodes and the bridge are preferably severed from the fixed molding by using a saw with a vertical feed. The mechanical processing according to the invention of the silicon rod is then carried out, as a result of which the silicon rod is given, at the severed position, a rod end which is free of cracks and flaking.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

DETAILED DESCRIPTION OF PREFERRED EMBODIMENTS

Figure 1:
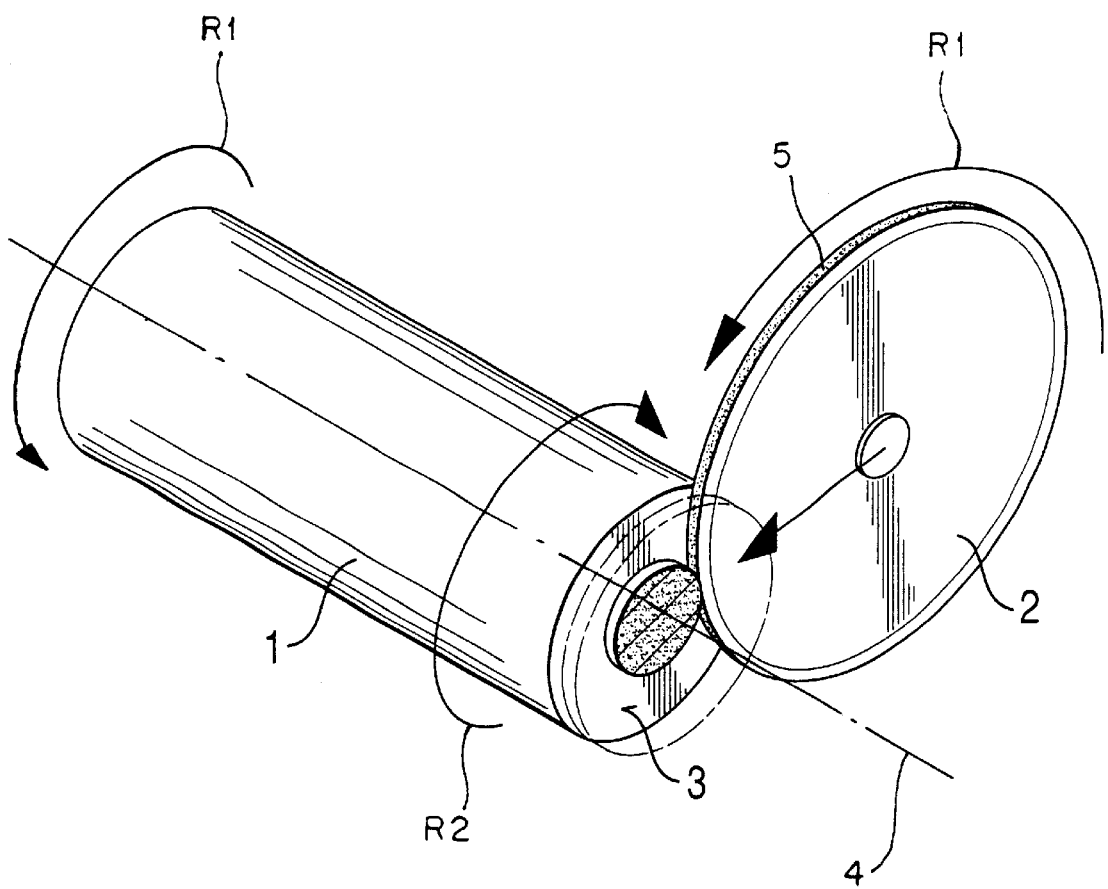
FIG. 1 shows an embodiment of the invention, in which the parting tool used is a parting grinding disk or a saw blade with an abrasive cutting edge.

Turning now in detail to the drawings, FIG. 1 shows in schematic form a polycrystalline silicon rod 1, which is rotated about its longitudinal axis 4. When the likewise rotating parting tool 2 acts on the rotating silicon rod a rotationally symmetrical cut face 3 is produced at one end of the silicon rod; and this face is free of cracks and flaking. During the rotation, the silicon rod is held, for example, on two supports. The feed rate of the parting tool is preferably 1 to 100 mm/min, particularly preferably 10 to 30 mm/min. With regard to the rotational speed of the parting tool, speeds of 20 to 80 m/s, in particular 30 to 40 m/s are preferred. The rotational speed of the rod is preferably 1 to 200 revolutions/min, particularly preferably 30 to 100 rev/min.

The directions of rotation of the silicon rod and of the parting tool can be the same direction R1 or opposite directions R1 and R2. Examples of the parting tool 2 include a grinding disk or a saw blade with an abrasive cutting edge 5.

Figure 2:
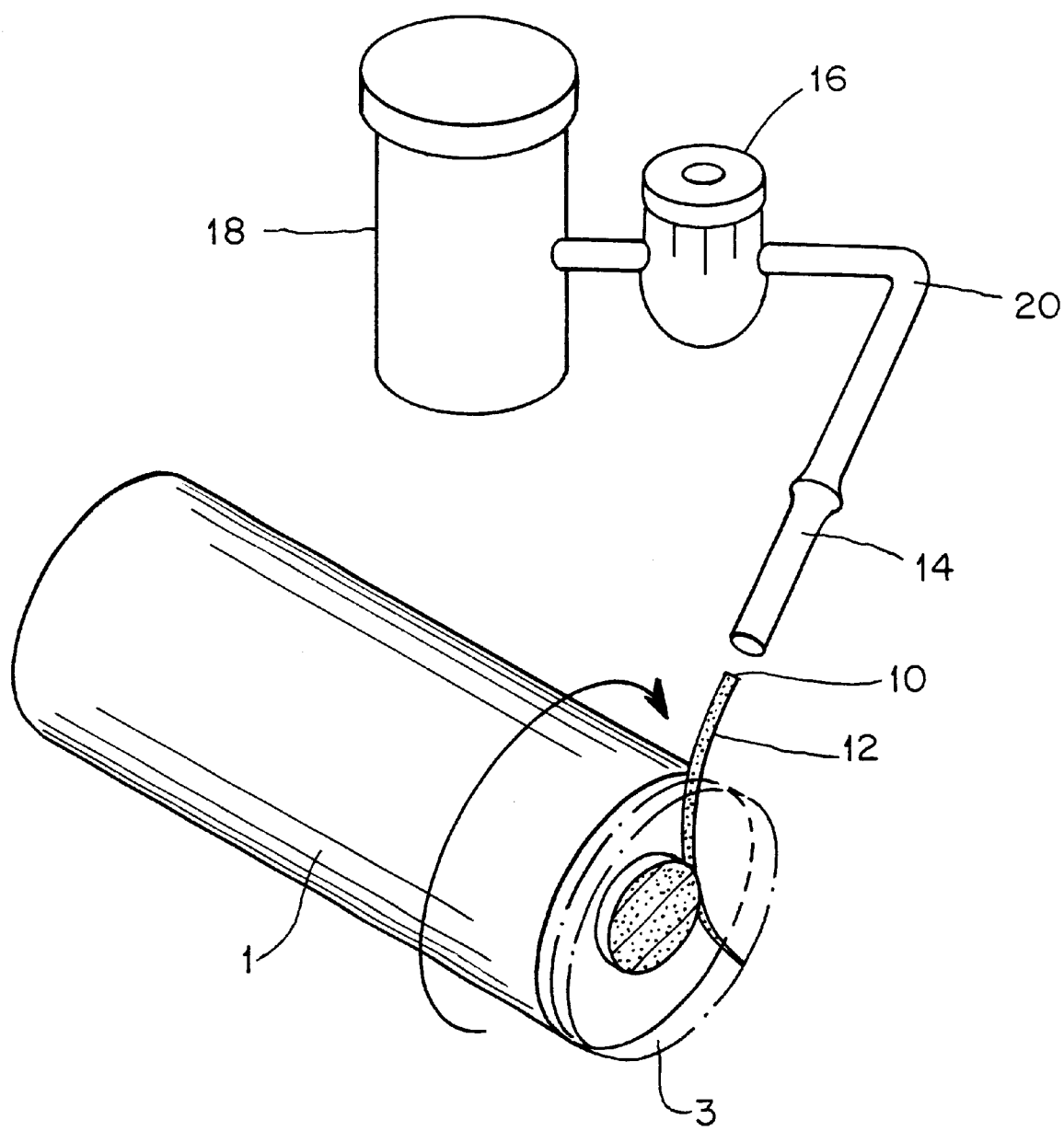
FIG. 2 shows a pressurized liquid jet as the parting tool.

FIG. 2 shows another embodiment of the invention, in which the parting tool is a pressurized liquid jet 10 which contains an abrasive 12. For the liquid jet, a water jet is particularly preferred. It is aimed at the rotating rod at a pressure of preferably 2000 to 5000 bar, particularly preferably 3500 to 4000 bar. The rotational speed of the rod is preferably between 1 and 200 revolutions/min, particularly preferably 30 to 100 revolutions/min. The liquid flow rate is preferably between 0.5 and 7 liters/min, particularly preferably 2 to 3 liters/min. The jet diameter, which determines the width of the cut, is preferably 0.2 mm to 2.0 mm, particularly preferably 0.6 mm to 1.2 mm.

In order that the bar 1 can be cut through with this liquid jet, the liquid 10 contains a granular abrasive 12. The throughput of the abrasive 12 in the liquid 10 is preferably 0.1 to 0.5 kg/min. Suitable abrasives are all granular cutting agents, such as slag materials, corundum materials, granite sand, carbide, nitride and olivine. Particular preference is given to the use of pure quartz sand (silicon dioxide), since in this way the cut surfaces of the silicon rods are not contaminated by materials of a different type. The grain size of the abrasive is preferably 0.1 to 1 mm, particularly preferably 0.1 to 0.3 mm.

The liquid jet 10 containing abrasive 12 is aimed through nozzle 14 which is supplied by pump 16 from reservoir 18 through line 20, as shown in FIG. 2.

The invention is particularly suitable for the production of a polycrystalline silicon rod which, at least one end, must have a crack-free and flaking-free cut surface. This is because it is to be used as a feed rod in zone pulling or is to be used as a refilling rod in crucible pulling or as a piece of rod for optimizing the level in a crucible.

A silicon rod obtained in accordance with the method can also be broken down into shorter units, down as far as wafers of polycrystalline silicon, by repeating the parting operation with a rotating workpiece. Such wafers are suitable in particular as the basis for the production of solar cells or as test wafers for methods in which monocrystalline semiconductor wafers are employed.

Accordingly, while a few embodiments of the present invention have been shown and described, it is to be understood that many changes and modifications may be made thereunto without departing from the spirit and scope of the invention as defined in the appended claims.

What is claimed is:

1. A method of producing a polycrystalline silicon rod, comprising depositing silicon on a carrier rod to produce a polycrystalline silicon rod molding;

rotating the polycrystalline silicon rod about a longitudinal axis and cutting the rod through with a parting tool; and producing a polycrystalline silicon rod having at least one rod end which is free of cracks and flaking.

2. The method as claimed in claim 1, comprising cutting the silicon rod through with a parting grinding disk; and rotating the parting grinding disk and the silicon rod in a range of group direction selected from the group consisting of same direction and opposite direction.

3. The method as claimed in claim 1, comprising cutting the silicon rod through with a saw blade having an abrasive cutting edge; and rotating the saw blade and the silicon rod in a range of group direction selected from the group consisting of same direction and opposite direction.

4. The method as claimed in claim 1, comprising cutting the silicon rod through with a pressurized liquid jet which contains an abrasive.

5. The method as claimed in claim 1, comprising rotating the silicon rod at a speed of 1 to 200 revolutions per minute.

6. The method as claimed in claim 1, comprising cutting the silicon rod through at a feed rate of 1 to 100 mm/min.

7. The method as claimed in claim 1, comprising separating silicon wafers off from the silicon rod.

* * * * *